United States Patent [19]

Sanyal et al.

[11] Patent Number: 4,872,261
[45] Date of Patent: Oct. 10, 1989

[54] METHOD OF AND APPARATUS FOR SURFACE MOUNTING ELECTRONIC COMPONENTS ONTO A PRINTED WIRING BOARD

[75] Inventors: Amalendu Sanyal, Andover, Mass.; Peter Moy, Atkinson, N.H.; Frank Cosentino, Wakefield, Mass.

[73] Assignee: Digital Equipment Corporation, Maynard, Mass.

[21] Appl. No.: 131,652

[22] Filed: Dec. 11, 1987

[51] Int. Cl.$^4$ ............................................... H05K 3/34
[52] U.S. Cl. ..................................... 29/840; 101/127; 228/180.2
[58] Field of Search ...................... 101/127; 228/180.2; 29/840

[56] References Cited

U.S. PATENT DOCUMENTS

| | | | |
|---|---|---|---|
| 4,084,506 | 4/1978 | Nakatani | 101/127 |
| 4,270,465 | 6/1981 | Lim | 101/127 |
| 4,311,267 | 1/1982 | Lim | 29/840 X |
| 4,733,813 | 3/1988 | LeMeau et al. | 29/840 X |

OTHER PUBLICATIONS

IBM Tech. Discl. Bull., vol. 28, No. 2, Jul. 1985, pp. 627–628.

Primary Examiner—Timothy V. Eley
Assistant Examiner—Carl J. Arbes
Attorney, Agent, or Firm—Nutter, McClennen & Fish

[57] ABSTRACT

A means for applying solder paste to surface contact pads on a printed wiring board with a stepped solder stencil is disclosed. The stepped stencil has sections of different thickness. Each stencil section has stencil openings formed therein through which solder is deposited onto the surface contact pads. The individual stencil openings are positioned so paste may be deposited through them on surface contact pads in registration underneath. The stencil sections have different thicknesses so solder can be deposited through all stencil openings of verying size with uniform results. Generally, the smaller sized stencil openings are formed in the thinner stencil sections. When this solder stencil is used it is possible to apply all the solder needed, to bond both standard component leads and fine pitch components in a single pass. Multiple solder applications and multiple vapor phase curing associated with surface mounting techniques, are eliminated.

22 Claims, 4 Drawing Sheets

METHOD OF AND APPARATUS FOR SURFACE MOUNTING ELECTRONIC COMPONENTS ONTO A PRINTED WIRING BOARD

FIELD OF THE INVENTION

This invention relates generally to the field of printed wiring assemblies and in particular provides a method and apparatus for applying solder deposits using a stencil.

BACKGROUND OF THE INVENTION

An important step in the manufacture of a modern electronic device is putting together printed wiring assemblies that carry components integral to the device. Each printed wiring assembly, alternatively called a module, consists of a printed wiring board with one or more of the electronic components that form the completely assembled electronic device mounted thereon. The printed wiring board is a rigid planar sheet of material with conductive traces formed thereon that provide separate conductive paths between the board components. An assembled printed wiring assembly is at least part of an electronic circuit that forms at least part of the electronic device. Usually, a modern electronic device, such as a computer or other processing system, includes one or more printed wire assemblies that carry thereon individual components that form the assembled device.

Traditionally, lead-in-hole connections have been used to mount electronic components onto printed wiring boards. These connections comprise a set of reinforced conductive leads or pins extending from the component that are inserted into plated holes on the printed wiring board. Solder, or a friction fit socket is used to secure the leads in the holes and provide an electrical connection to the conductors on the board.

However, frequently traditional lead-in-hole connections cannot be used to provide the connections required by modern electronic devices. This is because modern electronic devices generally include one or more integrated components that are mounted to multi-layer printed wiring boards. Each component may comprise one or more semiconducting components, known as "chips" that are packaged together in a carrier. Each chip comprises a large number of individual components fabricated together on a single, small section of semiconducting material to form an integrated circuit. A multi-layer printed circuit board comprises a number of individual layers, each with conductors thereon, that are stacked and pressed together to form a single wiring board. Multi-layer circuit boards provide most of the conductors that are needed to connect individual chips mounted thereon together to form a single integral circuit. The use of integrated components and multi-layer printed wiring boards has contributed to making modern electronic devices more powerful and smaller than their predecessors.

There are a number of reasons why it has proven impractical to use traditional mounting methods to attach some components to multi-layer printed wiring boards. Many assembled components include a large number of leads that provide the signal and power connections required for their operation. Providing a sufficient number of reinforced leads for each of the required connections significantly increases the overall size of a components, defeating the advantage of its miniaturization. Also, a significant amount of area would be taken up on the printed wiring board the components are mounted on by having to provide the plated holes required for all of the leads. Moreover, providing mounting holes on a multi-layer printed circuit board is further complicated because the conductors on each layer of the board must be designed around the holes which would extend therethrough. In other words, providing a printed wiring board with mounting holes restricts the paths of the conductors that can be formed thereon. This increases the difficulty of designing board conductors required for the specific circuit.

As a consequence of the problems and limitations associated with traditional lead-in-hole mounting, surface mounting of components to printed wiring boards has become a popular alternative. Surface mounting involves using solder to bond component leads to conductive contact pads on the surface of a printed wiring board. The surface contact pads are connected to conductors located on the board, or located within it in the case of multi-layer printed wiring boards. The solder used to provide the connection has sufficient strength to secure the components, leads to the contact pads on the surface of the board, and is sufficiently conductive to provide an electrical path therebetween.

Surface mounting does not require the large reinforced leads of lead-in-hole mounting. Nor does it require plated holes that extend through a printed wiring board that conductors must be designed around. Thus, surface mounting has become a popular method of attaching electrical components to printed wiring boards they are associated with.

An important consideration when surface mounting components is the need to initially apply the correct amount of solder to the board contact pads before the actual lead-to-contact pad bonding process. If too little solder is applied, it may be insufficient to secure the component to the contact pad. Consequently, over time a particular component attached to a printed wiring board may break off, rendering the entire circuit inoperable. On the other hand, if too much solder is applied, when the solder is heated during the bonding process, it may flow off the surface contact pad it is on and on to an adjacent contact pad. The solder, being conductive, would thus create an undesirable conductive path between the contact pads. Thus, the amount of solder that must be applied prior to the bonding must be precisely controlled.

One method of controlling the amount of solder applied during surface mounting is to apply the solder, in paste form, with a stencil. A metal stencil, with some flexibility, is placed a small distance above the printed wiring board that the components are to be mounted to. Formed in the stencil are openings that are in registration over the surface contact pads. Solder paste is then spread over the top of the stencil and pressed into the openings. A squeegee is then pressed down over the exposed surface of the stencil. The squeegee forces the adjacent portion of the stencil against the printed wiring board, and the solder paste through the openings. After the squeegee passes over the stencil portion, the stencil "snaps back" to its original location, leaving the appropriate amounts of solder on each of the contact pads. The components may then be bonded to the printed wiring board. This method of applying solder, and a discussion of surface mounting, is described in Mullen, How to Use Surface Mount Technology, incorporated herein by reference.

Recent advances in semiconductor manufacturing has made the fabrication of large scale integration (LSI) and very large scale integration (VLSI) chips possible. LSI and VLSI chips contain thousands to hundred of thousands of individual components per chip. LSI and VLSI chips are more compact than their predecessors, and can perform their intended functions more efficiently. Present and future advances in component manufacturing continue to make most electronic devices more powerful, and more miniaturized, than their forerunners.

To date, though, it has been difficult to apply the correct amount of solder to printed wiring board needed to bond LSI and VLSI components. This is because each of these components contain a large number of leads that are necessary for all the input and output signals these chips need and generate in the course of their operation. Components comprising LSI and VLSI chips with one hundred or more leads are not uncommon. These leads are spaced a small distance apart from each other, in other words, the between lead pitch is very fine. The leads are spaced close together at a fine pitch to minimize the overall size of the component package. Thus, only a small amount of solder is required to surface mount the small, fine pitch leads of LSI and VLSI components.

The problem of applying solder to contact pads for surface mounting of fine pitch leads is further complicated by the need to simultaneously apply larger amounts of solder required to mount standard leads found on other components. This is because most printed wiring assemblies carry components that have fine pitch leads, such as components comprising LSI and VLSI chips, also carry other components that have standard pitch leads, such as packaged conventional chips and discrete components such as resistors, capacitors and diodes.

Thus far, it has been difficult to apply to a printed wiring board the relatively large amounts of solder needed for standard lead bonding, and the smaller amounts of solder needed for fine pitch lead bonding. This is because the techniques used to apply one amount of solder do not work for applying the other amount of solder. As a result, various processes are being used to apply all the required solder with only limited degrees of success.

One such process is to use a single stencil with both large, widely spaced openings for the solder needed for standard lead bonding, and smaller, closely spaced openings needed for fine pitch lead bonding. The correct amount of solder needed for all the leads can often be applied by this process. However, this method has a significant failure rate since often a large number of boards with the incorrect amount of solder thereon are produced.

Another process is to first apply the solder needed to bond one set of leads and use a second stencil to apply the solder needed to bond the second set of leads. In practice, first the solder needed to bond the fine pitch leads is applied through a specifically designed stencil. The applied solder is then subjected to vapor phase reflow, which is a heating process, and a cleaning, so that it is solidified. Solder required for the standard lead bonding is then deposited on the printed circuit board. The components with standard leads are then mounted on the wiring board. The components with fine pitch leads are then mounted to the board. The process of mounting the components with fine pitch leads to the wiring board involves heating the board so that invariably the solder deposited thereon for the standard lead mounting is heated to the point where it starts to reliquefy, or reflow.

There are disadvantages associated with this method applying solder to the wiring board. Performing two stenciling steps substantially increases the complexity and the overall cost of the surface mounting process. For example, the solder initially applied for the fine pitch leads must be reflowed and cleaned so that when the second stencil is placed on the printed wiring board, the solder originally applied will not smear. Furthermore, during the heating step when the standard lead components are bonded, the solder initially applied for the fine pitch mounting is invariably heated, and may react with the metal forming the contact pads. This could adversely affect the composition, called the metalization, and integrity of the fine pitch lead bonding solder. Consequently, the joints formed by the solder may weaken to the point where lead break free from their contact pads.

Still another method of applying solder is to initially apply the correct amount of solder to each lead of a component, and then mount the component onto a wiring board. It is very costly to apply solder to the leads so that there is the correct amount on each lead. Moreover, this complicates surface mounting since a great deal of care must be taken to bond the fragile solder-coated leads so that each lead is properly bonded to a board contact pad, and that solder does not flow from the contact pads and from an electrical path between adjacent lead contact pad interfaces.

SUMMARY OF THE INVENTION

The invention provides a new and improved method for applying solder needed for surface mounting both fine pitch leads and standard leads.

In summary, the new process employs a stepped stencil with a thick section and a thin section. The stencil has a common flat surface from which the thick and thin sections are stepped from each other. Openings through which solder for conventional lead bonding is applied are formed in the thick section of the stencil. Openings through which solder for fine pitch bonding is applied are formed in the thin section of the stencil.

Solder is applied to a printed wiring board with this stencil by initially placing it, common flat surface down, immediately above the printed wiring board, so that the openings are in registration over the printed wiring board contact pads on which the solder is to be applied. Solder paste is then applied over the exposed surface of the stencil and a squeegee is then used to press the solder through the openings. After the solder is applied, the stencil is removed. The components, with standard leads, are then assembled on the wiring board and the solder is subjected to vapor phase reflow which bonds the standard leads to the contact pads, securing the components they are integral with to the board. The board is then cleaned. Components with fine pitch leads are then mounted to the board using an appropriate process. After the components with the fine pitch lead are mounted, the assembled board may be subjected to a final cleaning and pre-use inspection.

An advantage of this method is that only a single step is needed to apply all the solder needed for surface mounting both components having standard leads and components having fine pitch leads. Also, the solder is only subjected to one vapor phase reflow. The need to subject the board to an additional solder application step and an additional reflow step, and the expenses associated therewith, are eliminated.

Moreover, since the solder is only subjected to a single vapor phase reflow, the possibility of the tin and lead alloy forming the solder reacting with the copper of the surface contact pad and changing its composition is minimized. Thus, the consequential possibility of the bonding properties of the solder being adversely affected is essentially eliminated.

BRIEF DESCRIPTION OF THE DRAWINGS

This invention is pointed out with particularity in the claims. The above and further advantages of this invention may be better understood by referring to the following description taken in conjunction with the accompanying drawings, in which:

DETAILED DESCRIPTION OF THE INVENTION

Figure 1:
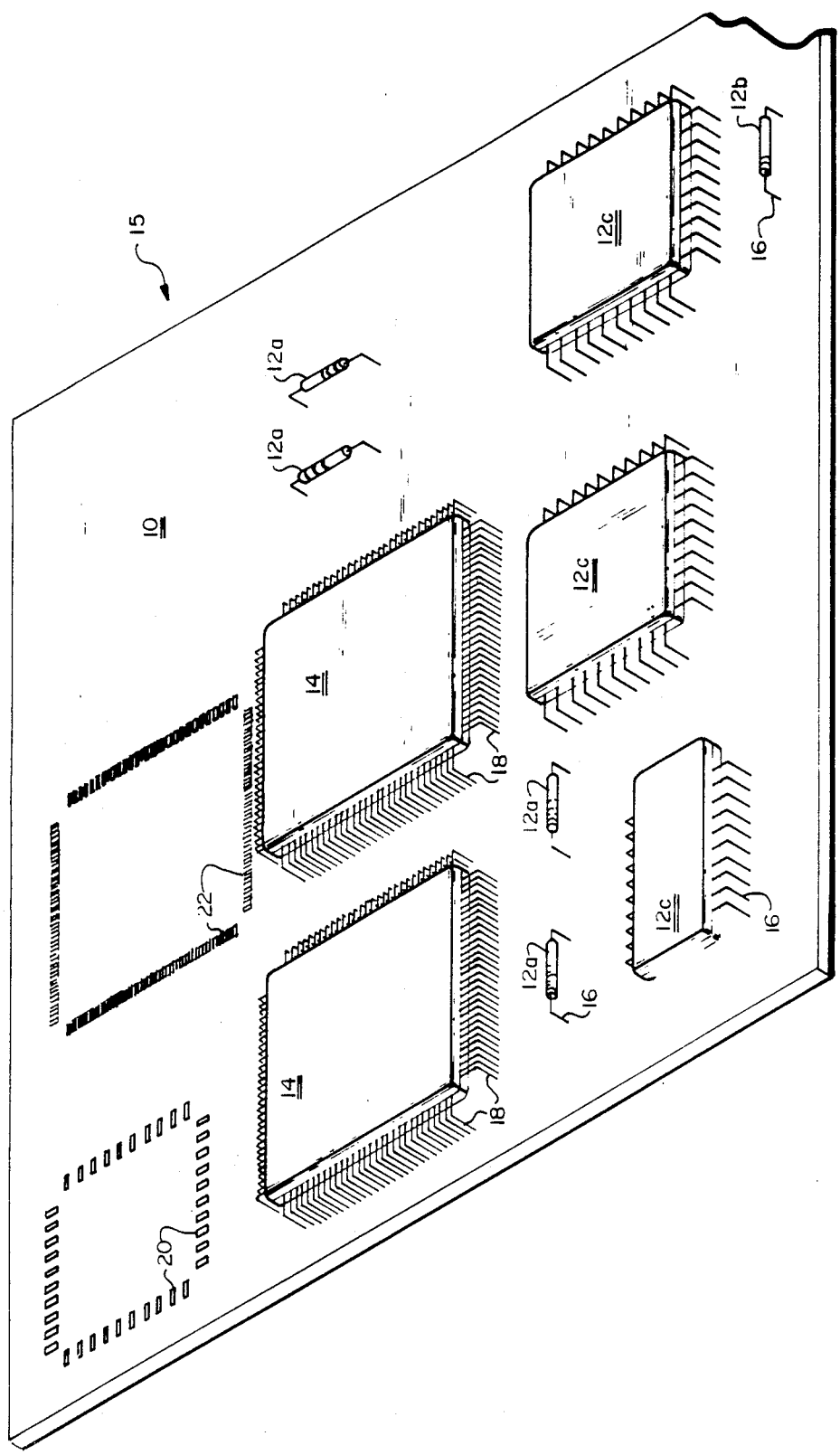
FIG. 1 is an isometric view of a printed wiring assembly carrying components mounted thereon using surface mounting techniques.

FIG. 1 illustrates a printed wiring board 10 with a number of components, generally identified by reference numbers 12 and 14, mounted thereon to form a printed wiring assembly 15. The printed wiring assembly 15 is part of an electronic device that employs the components 12 and 14 to perform electronic operations. The components 12 and 14 on the board include conventional components such as resistors 12a, diodes 12b and standard integrated components 12c. Components 14 include large scale integration (LSI) and very large scale integration (VLSI) chips. Leads 16 and 18 extending from the components 12 and 14, respectively, provide electrical connections between the components and surface contact pads 20 and 22, shown in an exposed section, on the printed wiring board 10. Conductors (not illustrated) within the printed wiring board 10 connected between the surface contact 20 and 22 pads function as electrical paths between the components 12 and 14, so that the components 12 and 14 can function together as an integral circuit.

The leads 16 of the components 12 are standard sized leads. The leads are at least 20 mils (0.020 inch) wide and are spaced apart so the centerlines of adjacent leads 16 is at least 50 mils apart, that is they have a 50 mil pitch. The leads 16 are surface mounted to surface contact pads 20 that have at least a 30 mil width and are spaced at least a 50 mil pitch.

Components 14 require a very large number of leads 18, often a hundred or more per component 14, in order to make the connections necessary for their operation. In order to minimize the area a component 14 and its leads 18 occupy on the printed wiring board 10, the size of the leads and the spacing between them is reduced. Thus, leads 18 are fine pitched leads, with an approximate per lead width of 14 mils or less, and an approximate between lead pitch of 25 mils or less. The fine pitch leads 18 are solder bonded to surface contacts 24 that each have a width of approximately 16 mils or less, and a pitch of approximately 25 mils or less.

Figure 1A:
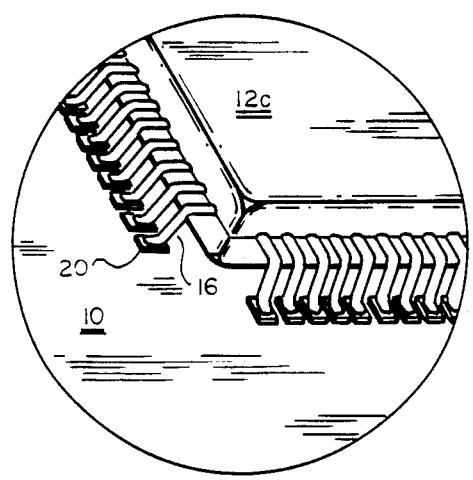
Figure 1a is a close up view of a section of the printed wiring assembly of FIG. 1 showing in greater detail how component leads are bonded to surface contact pads.

Figure 1a illustrates in greater detail how lead 16 or leads 16 illustrated, is surface bonded to surface contact pad 20. The lead 16 is gull wing-shaped, and have a bottom pad or end co-planar with the surface contact pad 20. It is the bottom pad of the lead 16 that is solder bonded to the appropriate surface contact pads 20. Leads 18 of components 14 may be similarly surface bonded to contact 22, (not illustrated).

Figure 2:
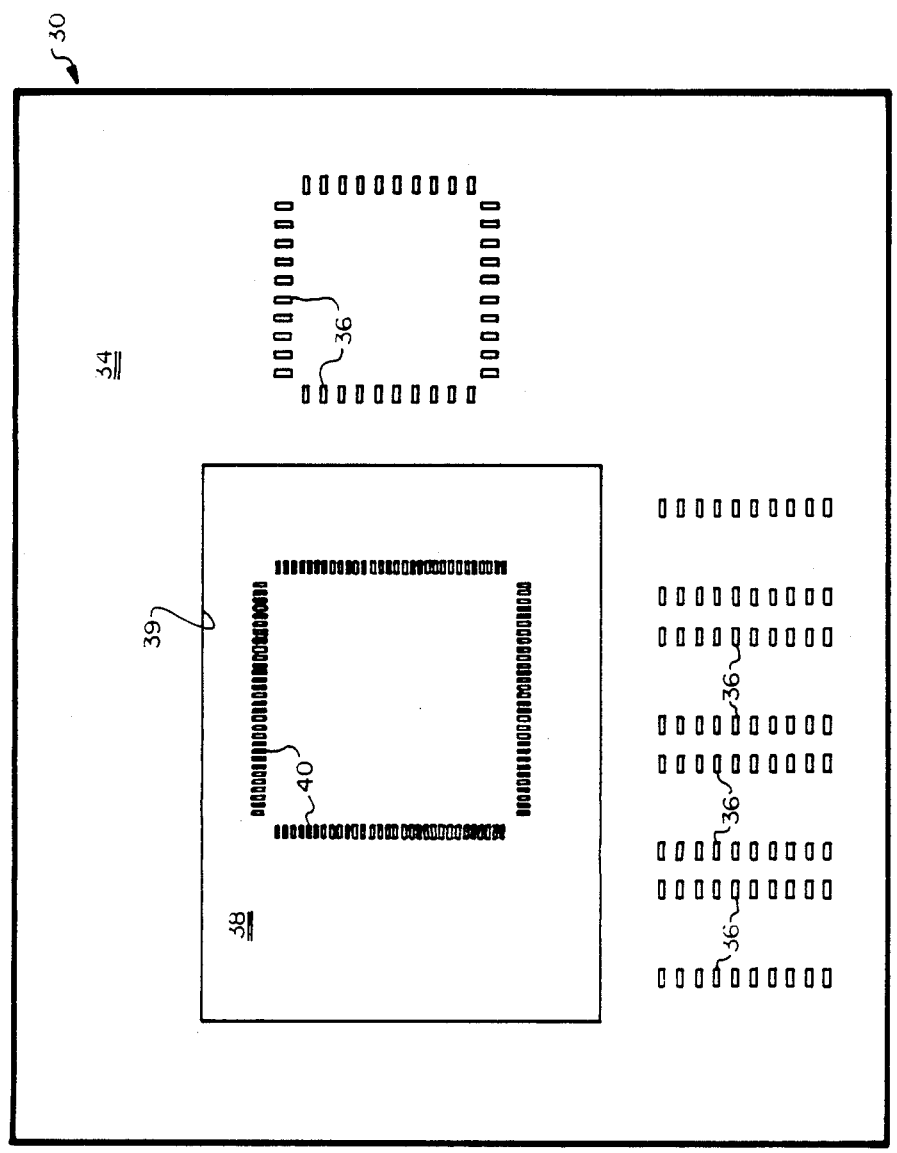
FIG. 2 is a top view of a stepped stencil used to apply solder in accordance with to this invention.
Figure 3:
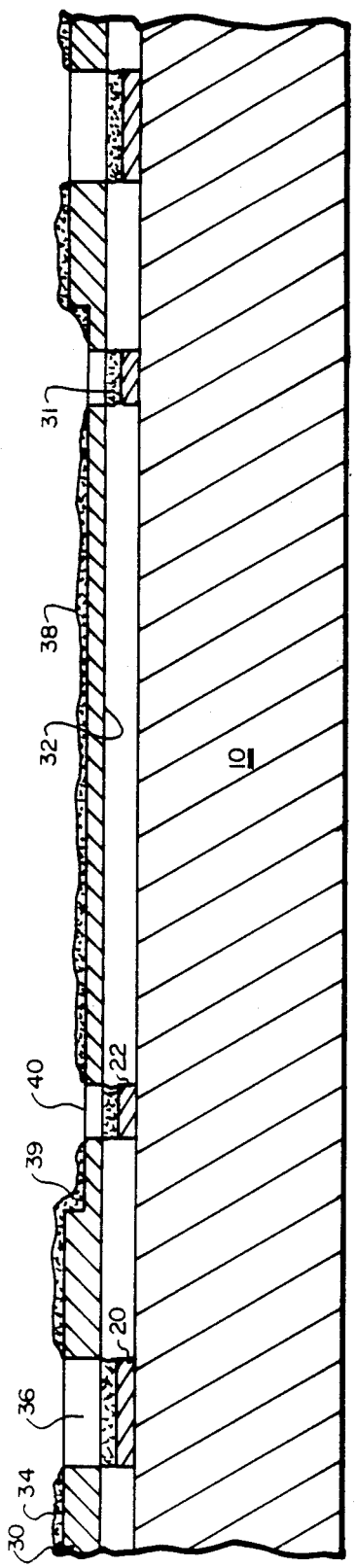
FIG. 3 is a cross-sectional view of solder applied to a printed wiring board in accordance with this invention.
Figure 4:
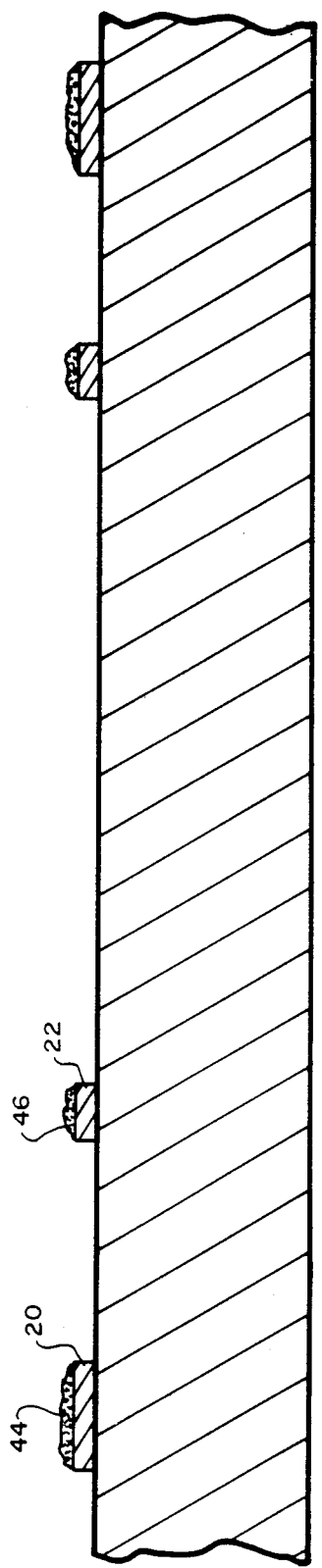
FIG. 4 is a perspective view of a section of a printed wiring board after solder has been applied in accordance with this invention.

FIGS. 2 and 3 illustrate a stepped solder stencil 30 used to apply solder paste 31 prior to the lead bonding process. The stepped solder stencil 30 has a common flat surface 32 that is positioned opposite the printed wiring board 10. The stepped soldering stencil 30 has a thick section 34, here approximately 10 mils thick, formed with openings 36 where solder is applied over the surface contact pads 20 for the conventional leads 16. The stepped solder stencil 30 also has a thin section 38, within the thick section 34, approximately 4 mils thick. The thick section 34 and thin section 38 of the stencil 30 are separated by a step 39. Formed in the thin section 38 are openings 40 through which solder is applied over the surface contact pads 22 for the fine pitch leads 18. Openings 36 have dimensions of approximately 30×76 mils and are spaced apart at least a 50 mil pitch, openings 40 have dimensions of approximately 10×50 mils and are spaced apart at an approximately a 25 mil pitch.

The stepped solder stencil 30 is formed of stainless steel, brass, or other suitable material which solder paste 31 may be passed through without the possibility of the solder reacting therewith. The stepped solder stencil 30 is fabricated by initially forming the openings 36 and 40 in a sheet of material forming the stencil 30. The sheet of material forming the stencil 30 has a thickness corresponding to that of the stencil's thick section 34. The openings 36 and 40 are formed in the stencil by means known in the art and are arranged in the pattern in which the solder is to be applied to the printed wiring board 10. After the openings 36 and 40 are formed, a selected portion of the stencil 30 around openings 40 is etched away to form the thin section 38.

Solder paste 31 is applied over the printed wiring board surface contact pads 20 and 22 with the stepped solder stencil 30. The stepped solder stencil 30 is placed just above the printed wiring board 10 so that the common flat surface 32 is spaced a small "snap distance" away from the printed wiring board 10 and the openings 36 and 38 are in registration over the appropriate surface contact pads 20 and 22, respectively.

According to methods known in the art, a squeegee is pressed against the stepped surface of stencil 30 to force it against the printed wiring board. During this process, the solder paste 31 is pressed into the openings 36 and 40. After the squeegee passes a section of the stencil 30, that section of the stencil snaps back to its normal position, leaving large mounds 44 of solder paste 31 over the surface contact pads 20 and smaller mounds 46 of solder paste 31 over the surface contact pads 22 as depicted in FIG. 3. Components 12 with standard leads 16 are then assembled on the printed wiring board 10, so that the leads are in the solder mounds 44 above the surface contact pads 20. The printed wiring board 10 is then dried and the solder mounds thereon subjected to a standard vapor phase reflow so that the individual solder mounds 44 and 46 are hardened. After the reflow step, the standard leads 16 are secured to the surface contact pads 20 by the hardened solder mounds 44.

After the components 12 with standard leads 16 have been mounted onto the printed wiring board 10, the printed wiring board is cleaned and the components 14 with fine pitch leads 18 are mounted thereon by a known process. One such process for bonding the components 14 with fine pitch leads to the appropriate board contact pads 22 is the Farco process developed by Fabriques d'Assortiments Reunies SA of Le Locle, Switzerland. The printed wiring assembly 15 is thus completely assembled and ready for a final cleaning, pre-use inspection and testing.

Use of the stepped solder stencil 30 allows the correct amounts of solder needed for both the standard lead 16 bonding and fine pitch lead 18 bonding to be applied in a single pass. This diminishes the need to apply the solder in two or more steps, and the consequential need to subject the solder to one or more intermediate vapor reflow steps to prevent solder smear. Elimination of the intermediate solder stenciling and vapor phase steps significantly improves the overall efficiency and economics of the surface mounting process.

Moreover, since the solder is not subjected to repeated vapor phase reflows, the chance that it will react with the surface contact pads 20 or 22 so as to cause a change in its metalization is substantially reduced. Thus, the risk of the solder's composition changing so that it will no longer properly bond the leads 16 and 18 is essentially eliminated.

The foregoing description has been limited to a specific embodiment of the invention. It will be apparent, however, that variations and modifications may be made to the invention with the attainment of some or all of the advantages of the invention. For example, in the illustrated embodiment there is one stencil thin section 38 located within a single thick section 34. In alternative embodiments of the invention there may be multiple thick sections 34 and thin sections 38 and/or the individual sections 34 and 38 may be located anywhere on the stencil in order to form the necessary pattern of solder mounds 44 and 46. Also, in the illustrated embodiment the stencil has sections of just two thicknesses. In some embodiments of the invention it may be desirable to provide the stencil with three or more sections of different thicknesses in order to insure the correct amount of solder is applied over all the contact pads on a printed wiring board in a single pass.

Moreover, in the illustrated embodiment of the invention, the thick section 34 and thin section 32 are separated by a well defined step 39. In an alternative embodiment of the invention, the sections of different thickness may be separated by an inclined intermediate surface that provides a gradual transition between the sections forming the openings through which the solder paste is applied. The inclined intermediate section may work best with certain solder paste application devices. Furthermore, the dimensions set forth in the description are to illustrate just one example of how this stencil may be built and used. Other stencils with different sized openings for solder, spaced apart at different pitches, and with different thickness stencil sections, may be constructed according to this invention.

Therefore, it is the object of the appended claims to cover all such variations and modifications as come within the true spirit and scope of the invention.

What is claimed as new and desired to be secured by Letters Patent of the United States is:

1. A method of surface mounting electrical components, with leads extending therefrom, to a printed wiring board with surface contact pads by bonding the component leads to the printed wiring board surface contact pads, the printed wiring board including surface contact pads adapted for bonding standard pitch electronic component leads thereto and surface contact pads adapted for bonding fine pitch electronic components leads thereto, the method including the steps of:
   (A) placing a stepped solder stencil over said printed wiring board, said stencil having a common flat surface disposed against the printing wiring board and an exposed surface opposite said flat surface, said stencil including at least two sections of different thickness, such that there is at least one thin section of a selected thickness and at least one thick section having a thickness greater than that of said thin section, and openings formed in said stencil sections, said openings positioned so that when said stencil is aligned over the printed wiring board, said openings formed in said thick section are in registration over the surface contact pads for the standard pitch leads and said openings formed in said thin section are in registration over the surface contact pads for the fine pitch leads;
   (B) applying solder paste over the exposed surface of said stencil;
   (C) pressing said solder paste on said stencil exposed surfaces through said stencil openings whereby thick mounds of solder paste are deposited on the surface contacts for the standard pitch leads and thin mounds of solder paste are deposited on the surface contact pads for the fine pitch leads; and
   (D) removing said stencil so that said mounds of solder paste are left on the printed wiring board surface contact pads.

2. The method of surface mounting electrical components according to claim 1 wherein sufficient openings are formed in said stencil so that solder paste is applied to substantially all of said printed wiring board surface contact pads.

3. The method of surface mounting electrical components according to claim 1 further including the steps of:
   (A) after said stencil is removed, assembling on the printed wiring board the electronic components with standard pitch leads so that the leads are on the solder mounds on the surface contact pads for the standard pitch leads;
   (B) subjecting all of said solder mounds to a reflow so that the leads of the standard pitch lead electronic components are bonded to the associated printed wiring board surface contact pads; and
   (C) assembling on the printed wiring board the electronic components with fine pitch leads so that the leads are solder bonded to the surface contact pads for the fine pitch leads.

4. The method of surface mounting electrical components according to claim 3 wherein the printed wiring board surface contact pads for the standard pitch leads are at least 30 mils wide and spaced apart by at least a 50 mil pitch.

5. The method of surface mounting electrical components according to claim 3 wherein the printed wiring board surface contact pads for the fine pitch leads have a maximum width of 16 mils and a maximum pitch of a b 25 mils.

6. The method of surface mounting electrical components according to claim 1 wherein said solder mounds deposited on the printed wiring board surface contact pads for the standard pitch electronic component leads have a width of at least 30 mils and are spaced apart at least a 50 mil pitch, and said solder mounds deposited on the printed wiring board surface contact pads for the fine pitch leads have a maximum width of 16 mils and a maximum pitch of 25 l mils.

7. The method of surface mounting electrical components according to claim 6 further including the steps of:
   (A) after removal of said stencil, assembling a first set of electronic components on the printed wiring board so that the leads are in said solder mounds on the surface contact pads for the standard pitch leads;
   (B) subjecting said solder mounds to a vapor phase reflow so that the leads of said first set of electronic components are bonded to the first set of surface contact pads; and
   (C) assembling a second set of electronic components to the printed wiring board so that the leads of said second set of electronic components are solder bonded to the second set of surface contact pads.

8. The method of surface mounting electrical components according to claim 4 wherein the printed wiring board surface contact pads for the fine pitch leads have a maximum width of 16 mils and a maximum pitch of 25 mils.

9. The method of surface mounting electrical components according to claim 8 wherein said solder mounds deposited on the printed wiring board surface contact pads for the standard pitch leads have a width of at least 30 mils and are spaced by at least a 50 mil pitch, and said solder mounds deposited on the printed wiring board surface contact pads for the fine pitch leads have a maximum width of 16 mils and a maximum pitch of 25 mils.

10. The method of claim 1 wherein said openings formed in said stencil thick section have a width of at least 30 mils and that are spaced by at least a 50 mil pitch.

11. The method of claim 1 wherein said openings formed in said stencil thin section have a maximum width of 16 mils and a maximum pitch of 25 mils.

12. The method of claim 10 wherein said stencil thick section is approximately 10 mils thick.

13. The method of claim 11 wherein said stencil thin section is approximately 4 mils thick.

14. A method of depositing solder paste on a printed wiring circuit board with contact pads adapted for the bonding of electronic components having standard pitch leads and for electronic components having fine pitch leads, the method including the steps of:
   (A) placing a stepped solder stencil over the printed wiring board, said stencil having a common flat surface disposed against the printing wiring board and an exposed surface opposite said flat surface, said stencil including at least two sections of different thickness, such that there is at least one thin section of a selected thickness and at least one thick section having a thickness greater than that of said thin section, and openings in said stencil sections, said openings positioned so that when said stencil is aligned over the printed wiring board, said openings in said thick section are in registration over the surface contact pads for the standard pitch leads, and said openings in said thin section are in registration over the surface contact pads for the fine pitch leads;
   (B) applying solder paste over the exposed surface of said stencil;
   (C) pressing said solder paste on said stencil exposed surfaces through said stencil openings whereby thick mounds of solder paste are deposited on the surface contact pads for the standard pitch leads, and thin mounds of solder paste are deposited on the surface contact pads for the fine pitch leads; and
   (D) removing said stencil so that said mounds of solder paste are left on the printed wiring board surface contact pads.

15. The method of claim 14 wherein sufficient openings are formed in said stencil so that solder paste is applied to substantially all of said printed wiring board surface contact pads.

16. The method of claim 14 wherein the printed wiring board surface contact pads for the standard pitch leads thereto are least 30 mils wide and spaced by at least a 50 mil pitch.

17. The method of claim 14 wherein the printed wiring board surface contact pads adapted for the fine pitch leads have a maximum width of 16 mils and a maximum pitch of 25 mils.

18. The method of claim 16 wherein the printed wiring board surface contact pads for the fine pitch leads have a maximum width of 16 mils and a maximum pitch of 25 mils.

19. The method of claim 14 wherein said solder mounds deposited on the printed wiring board surface contact pads for the standard pitch leads have a width of at least 30 mils and a pitch of at least a 50 mils, and said solder mounds deposited on the printed wiring board surface contact pads for the fine pitch leads have a maximum width of 16 mils and a maximum pitch of 25 mils.

20. The method of claim 14 wherein said openings formed in said stencil thick section have a width of at least 30 mils and a pitch of at least a 50 mils.

21. The method of claim 14 wherein said openings formed in said stencil thin section have a maximum width of 16 mils and a maximum pitch of 25 mils.

22. The method of claim 20 wherein said stencil thick section is approximately 10 mils thick.

* * * * *